(12) United States Patent
Sheng

(10) Patent No.: US 8,201,135 B2
(45) Date of Patent: Jun. 12, 2012

(54) PRINTED CIRCUIT BOARD LAYOUT SYSTEM AND METHOD THEREOF

(75) Inventor: Xiao-Cheng Sheng, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 199 days.

(21) Appl. No.: 12/780,945

(22) Filed: May 17, 2010

(65) Prior Publication Data
US 2011/0107282 A1 May 5, 2011

(30) Foreign Application Priority Data
Oct. 29, 2009 (CN) .............................. 2009 1 030905

(51) Int. Cl.
*G06F 17/50* (2006.01)

(52) U.S. Cl. ........ 716/137; 716/100; 716/101; 716/102; 716/111; 716/112; 716/136; 716/139; 438/111; 29/739; 29/704; 29/741; 29/747; 29/748; 29/749; 703/13; 703/14; 703/21; 703/22

(58) Field of Classification Search .......... 716/100–102, 716/111–112, 136–137, 139; 438/11; 29/739–741, 29/747–749; 703/13–14, 21–22
See application file for complete search history.

(56) References Cited

U.S. PATENT DOCUMENTS

| | | | |
|---|---|---|---|
| 7,315,990 B2 * | 1/2008 | Archambeault et al. | 716/112 |
| 7,921,390 B2 * | 4/2011 | Archambeault et al. | 716/106 |
| 2010/0218151 A1 * | 8/2010 | Nakano | 716/5 |

* cited by examiner

Primary Examiner — Nghia Doan
(74) Attorney, Agent, or Firm — Altis Law Group, Inc.

(57) ABSTRACT

A method for managing error information of a printed circuit board layout system is provided. The system provides an error file recording names of all the errors to be displayed in wiring diagrams, generates wiring diagram files, outputs a first user interface showing one wiring diagram. Each of the wiring diagram files includes an attribute table for describing error information. The attribute table comprises the names and the set of coordinates. The method comprises obtaining the error file and the attribute table, outputting a second user interface comprising a first display area and a second display area, outputting the name in the first display area, analyzing the obtained attribute table to provide a classifying table. Then outputting one selected name and at least one set of coordinates corresponding to the one selected name in the second display area according to the classifying table. A related system is also provided.

6 Claims, 4 Drawing Sheets

PRINTED CIRCUIT BOARD LAYOUT SYSTEM AND METHOD THEREOF

BACKGROUND

1. Technical Field

The present disclosure relates to the printed circuit board layout field and, particularly, to a printed circuit board layout system and a method thereof.

2. Description of Related Art

Allegro is known software for printed circuit board layout. In Allegro, error markers are displayed at corresponding positions of a currently displayed wiring diagram where errors have been found. If users want to know more detailed information about one or more of the errors, for example, error type, they have to select each error one by one for more information to appear, which is inconvenient.

BRIEF DESCRIPTION OF THE DRAWINGS

The components of the drawings are not necessarily drawn to scale, the emphasis instead being placed upon clearly illustrating the principles of a printed circuit board layout system and a method thereof. Moreover, in the drawings, like reference numerals designate corresponding parts throughout several views.

DETAILED DESCRIPTION

Figure 1:
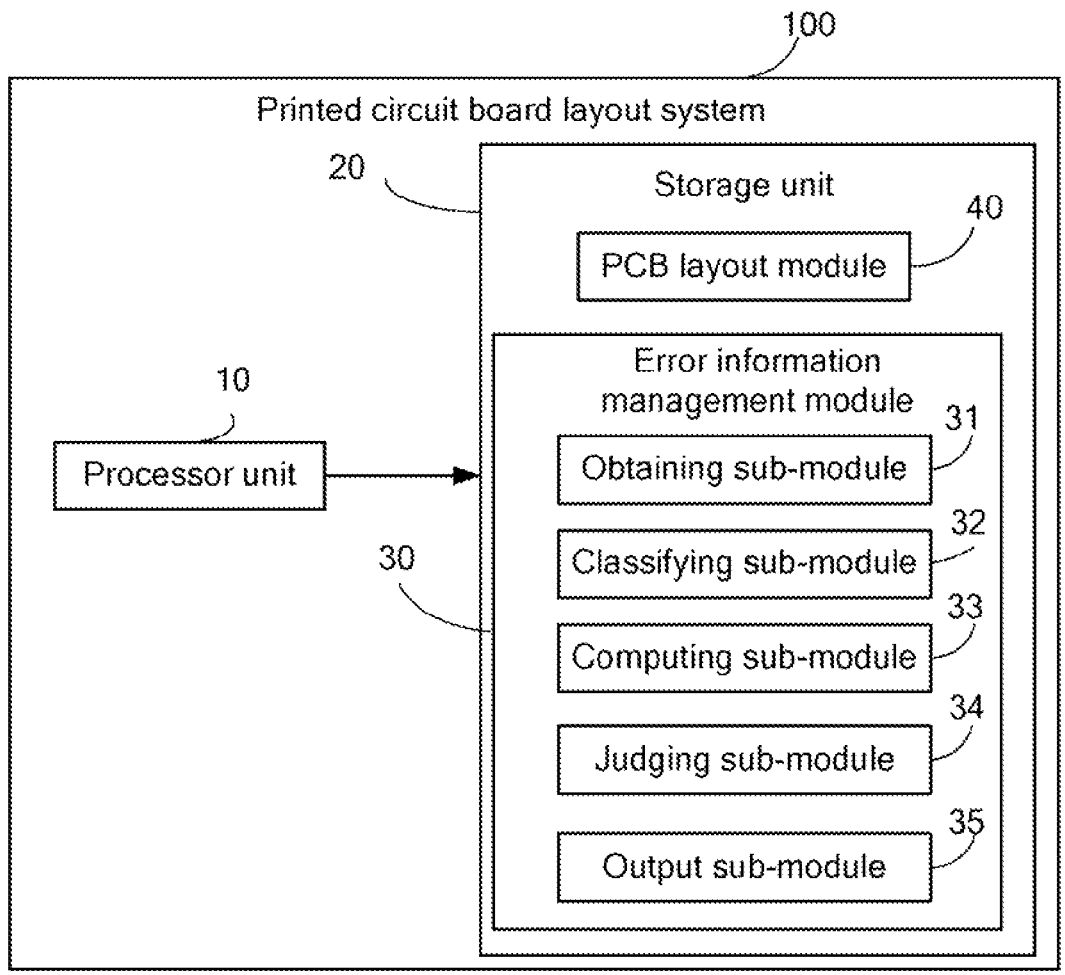
FIG. 1 is a block diagram of a printed circuit board layout system in accordance with an exemplary embodiment.
Figure 2:
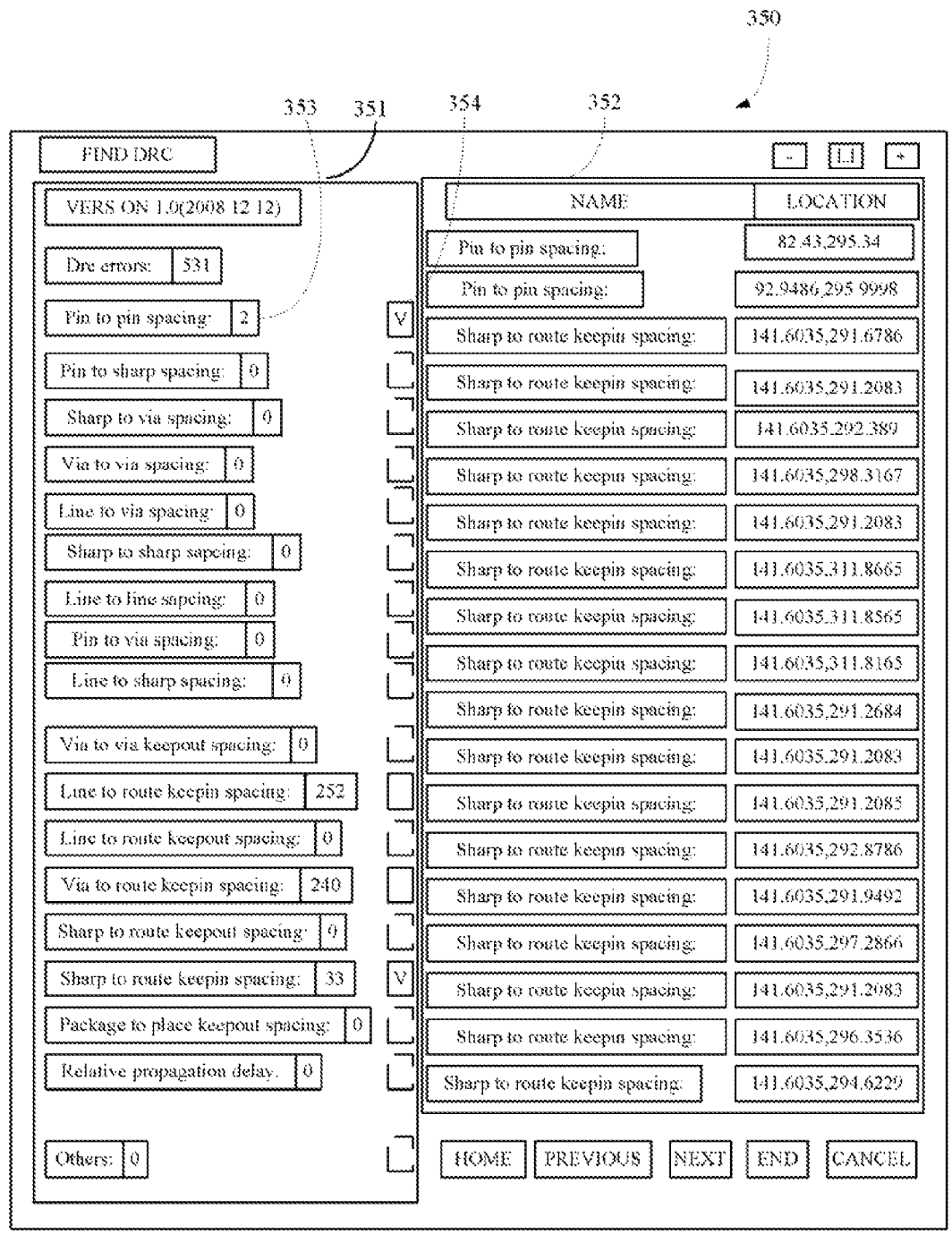
FIG. 2 is a schematic view showing error markers in a displayed wiring diagram of the printed circuit board layout system of FIG. 1.

Referring to FIGS. 1-2, a printed circuit board (PCB) layout system 100 in accordance with an exemplary embodiment is shown. The system 100 includes a processor unit 10 and a storage unit 20. The processor unit 10 executes a plurality of function modules in the storage unit 20 to perform various functions. The system 100 can be used to generate wiring diagram files. The wiring diagram files are stored in the storage unit 10. The system 100 can check for wiring errors in the diagrams according to default rules. The system 100 provides an error file listing names (names may reflect error type or parts involved for example) of all errors that are displayed in a displayed diagram. In the embodiment, the storage unit 20 stores an error information management module 30 and a PCB layout module 40.

The module 40 is configured to generate wiring diagram files according to input wiring diagrams, and outputs a first user interface 200 showing an opened wiring diagram (see FIG. 2). The module 40 is further configured to check for errors in opened wiring diagram files, and place error markers 11 in the wiring diagram to indicate where the errors are. In the embodiment, each of the wiring diagram files includes an attribute table therein for storing information of any errors found. The attribute table is configured to include names and set of coordinates of error found. The set of coordinates are used to indicate where errors have been found in a wiring diagram. The wiring diagram files are stored in the storage unit 10.

The error information management module 30 includes an obtaining sub-module 31, a classifying sub-module 32, a computing sub-module 33, a judging sub-module 34, and an output sub-module 35.

The obtaining sub-module 31 obtains the error file and the attribute table of one opened wiring diagram file from the storage unit 20 in response to user input. The obtaining sub-module 31 outputs the obtained error file to the output sub-module 35, and outputs the obtained attribute table to the classifying sub-module 32.

Figure 3:
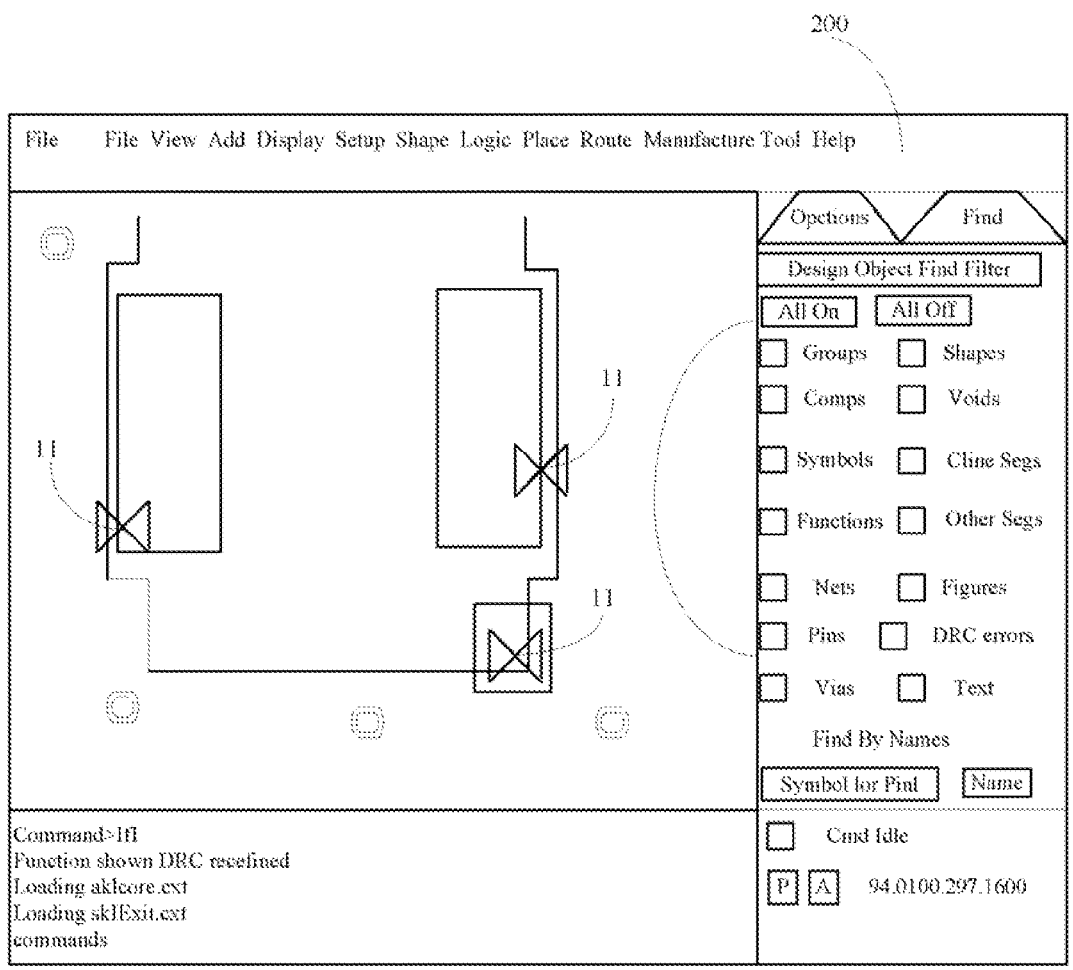
FIG. 3 is a schematic view showing detailed error information of the printed circuit board layout system of FIG. 1.

Referring to FIG. 3, the output sub-module 35 outputs a second user interface 350 including a first display area 351 and a second display area 352. In the embodiment, the first user interface 200 and the second user interface 350 can be simultaneously displayed in the electronic device. The output sub-module 35 outputs the error file in the first display area 351. In the embodiment, the error file further includes number boxes 353 and checkboxes 354 displayed with the error names in the first display area 351. Each name corresponds to one number box 353 and one checkbox 354. The initial number in each of the number boxes 353 is zero. The number boxes 353 are for indicating how many of the associated error has been found in the current wiring diagram file. The checkboxes 354 can be used by users to select which errors they want more detailed information on but are only selectable if any of those errors are found to exist and are by default empty and not selectable by users.

The classifying sub-module 32 analyzes the obtained attribute table to provide a classifying table, as shown below. The classifying table includes a name column and a coordinate column. In the table, each name corresponds to one or more set of coordinates. The classifying sub-module 32 outputs the classifying table to the computing sub-module 33.

| Classifying Table | |
|---|---|
| Name | Coordinate |
| Pin to Pin Spacing | (82.43, 295.34)(92.9486, 295.9998) |
| ... | ... |
| Shape to Route Keep in Spacing | (141.6035, 291.6786) |
|  | (141.6035, 291.2083) |
|  | ... |
|  | (141.6035, 290.2085) |
| ... | ... |

The computing sub-module 33 is configured to count how many sets of coordinates are there for each name in the classifying table. The computing sub-module 33 outputs the counts to the judging sub-module 34 and the output sub-module 35.

The output sub-module 35 records the count for each name in the corresponding number box 353. As shown in FIG. 3, the initial number of the number box 353 corresponding to the name is zero, and if the computing sub-module 33 counts any set of coordinates corresponding to a name, the output sub-module 35 changes the count in the box 353 to the new count, thus the user can quickly know how many of each kind of errors exist.

The judging sub-module 34 checks for a count greater than zero in each box 353, and when a count greater than zero is found, the corresponding checkbox 354 is made user selectable, otherwise the checkboxes 354 are not selectable.

In the embodiment, if the user selects a user selectable option, for example, a click in the checkbox 354, the output sub-module 35 outputs the error names corresponding to the checkbox 354 and the set of coordinates corresponding to each of that error found, in the second display area 352. If one set of displayed coordinate is selected by the user, that is, a click on a set of coordinate, the output sub-module 35 highlights the set of coordinate, and the module 40 highlights the error marker 11 in the displayed wiring diagram, corresponding to the selected set of coordinate in the first user interface 200. Thus, the user can quickly know where the error is. The module 40 can also output an error window (not shown) displaying the names and the set of coordinates of the error in the first user interface 200.

Figure 4:
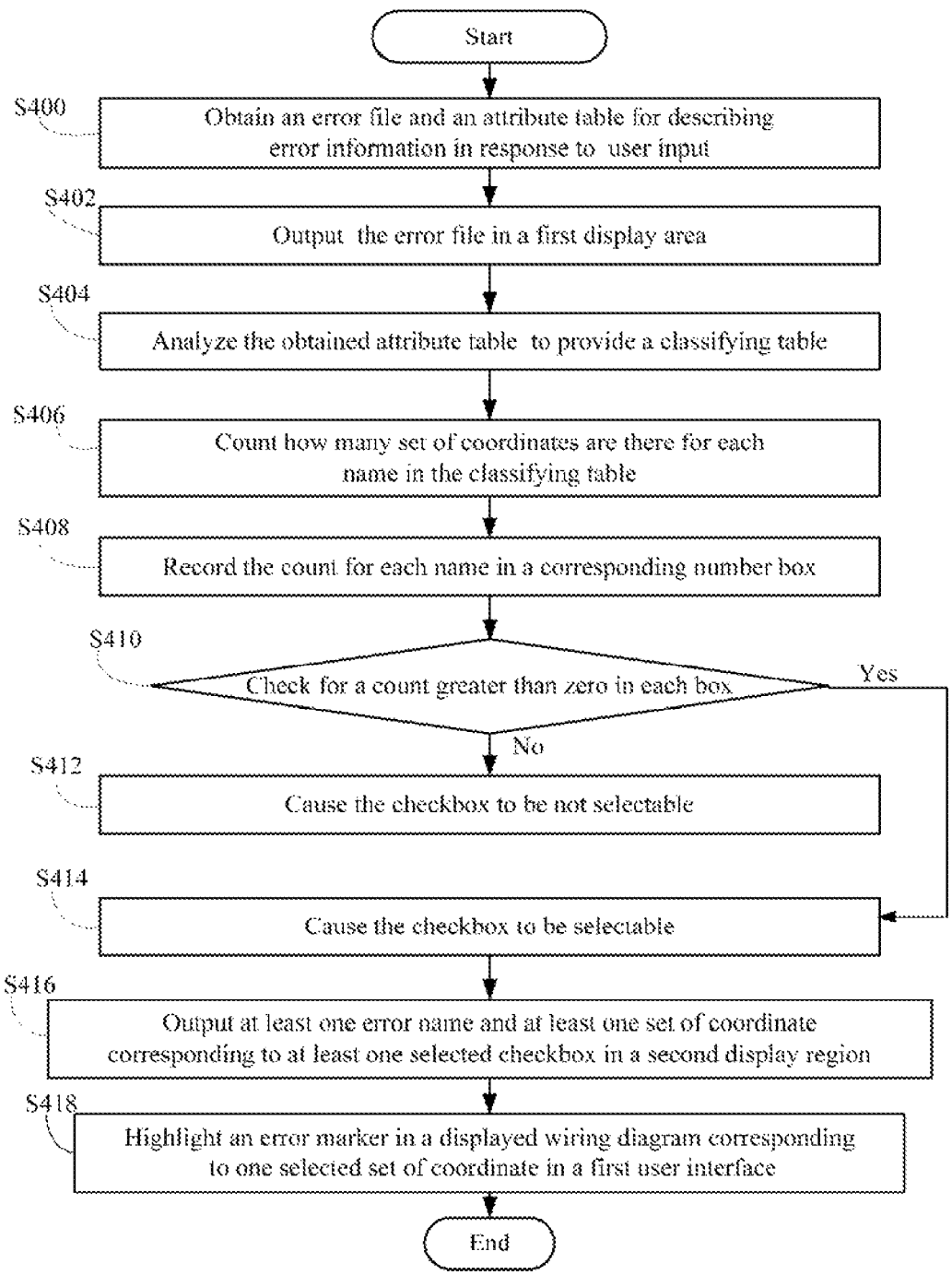
FIG. 4 is a flowchart of a method for managing error information in accordance with an exemplary embodiment.

FIG. 4 is a flowchart of a method for managing error information a printed circuit board layout system in accordance with an exemplary embodiment.

In step S400, the obtain sub-module obtains the error file and the attribute table of one opened wiring diagram file from the storage unit 10 in response to user input.

In step S402, the output sub-module 35 outputs the error file in the first display area 351. Each error name in the error file corresponds to one number box 353 and one checkbox 354. The initial count in each number box 363 is zero.

In step S404, the classifying sub-module 32 analyzes the obtained attribute table to provided a classifying table. The classifying table includes a name column and a coordinate column. In the table, each name corresponds to one or more coordinate sets.

In step S406, the computing sub-module 33 counts the number of set of coordinates corresponding to each of the names in the classifying table.

In step S408, the output sub-module 35 records the count for each name in the corresponding number box 353.

In step S410, the judging sub-module 34 checks for a count greater than zero in each box 353. If the number in one number box 353 is zero, the procedure goes to step S412, otherwise the procedure goes to step S414.

In step S412, the output sub-module 35 causes the checkbox 354 corresponding to the one number box 353 to be not selectable, thus, the user cannot select the checkbox 354.

In step S414, the output sub-module 35 causes the checkbox 354 corresponding to the one number box 353 to be selectable, thus, the user can select the checkbox 354.

In step S416, the output sub-module 35 outputs the error names and the at least one set of coordinates in the second display area 352 corresponding to any user selected checkboxes 354.

In step S418, when one displayed set of coordinate is selected by the user, the output sub-module 35 highlights the set of coordinate, and the module 40 highlights the error marker 11 in the displayed wiring diagram corresponding to the selected set of coordinate in the first user interface 200. The module 40 can also output an error window displaying the name and the set of coordinates of the error in the first user interface 200.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. A printed circuit board layout system, comprising:
a storage unit storing an error file listing names of all the errors which the system is able to check and a plurality of function modules; and
a processor unit executing the plurality of function modules;
wherein the plurality of function modules comprises:
a PCB layout module configured to generate wiring diagram files according to input wiring diagrams, output a first user interface showing a wiring diagram that has been opened, and further check for one or more errors in opened wiring diagram files, wherein each of the wiring diagram files comprises an attribute table therein for storing information of any errors found, the attribute table comprises names and set of coordinates of errors found;
an error information management module, comprising:
an obtaining sub-module configured to obtain the error file and the attribute table of one opened wiring diagram file in response to user input;
an output sub-module configured to output a second user interface comprising a first display area and a second display area, wherein the output sub-module outputs the error file in the first display area; and
a classifying sub-module configured to analyze the obtained attribute table to provide a classifying table, wherein the classifying table comprise a name column and a coordinate column, each name corresponds to at least one set of coordinates;
the output sub-module further configured to output a selected name and the at least one set of coordinates corresponding to the selected name in the second display area according to the classifying table;
the output sub-module is further configured to output number boxes indicating occurrences of errors associated with names in the first display area, each of the names corresponds to one number box, and the initial number in each of the number boxes is zero;
the plurality of the function modules further comprises a computing module configured for counting how many sets of coordinates are there for each name in the classifying table, and the output sub-module is further configured to output the counts in corresponding number boxes.

2. The system as described in claim 1, wherein the plurality of the function modules further comprises a judging sub-module configured for checking for a count greater than zero in each box, and if the number in one number box is zero, the output sub-module causes the checkbox corresponding to the one number box to be not selectable, and if the number in one number box is greater than zero, the output sub-module causes the checkbox corresponding to the one number box to be selectable.

3. The system as described in claim 1, wherein if one set of displayed coordinate is selected, the output sub-module highlights the set of coordinate, and the module highlights the error marker corresponding to the selected set of coordinates in the first user interface in the displayed wiring diagram.

4. A method for managing error information of a printed circuit board layout system, the method comprising: providing, a system, an error file listing names of all the errors which the printed circuit board system is able to check, generate wiring diagram files according to input wiring diagrams, output a first user interface showing one wiring diagram when the wiring diagram file of the one wiring diagram that has been opened, and further check for one or more errors in opened wiring diagram files, each of the wiring diagram files comprises an attribute table for storing information of any errors found, the attribute table comprising names and set of coordinates of errors found;
obtaining the error file and the attribute table of one opened wiring diagram file in response to user input; outputting number boxes in the first display area, wherein each of the names corresponds to one number box, and the initial number of each of the number boxes is zero;

outputting a second user interface comprising a first display area and a second display area, and outputting the error file in the first display area;

analyzing the obtained attribute table to provide a classifying table, wherein the classifying table comprise a name column and a coordinate column, each name corresponds to at least one set of coordinates; counting how many set of coordinates are there for each name in the classifying table and outputting the counts in corresponding number boxes; and outputting a selected name and the at least one set of coordinates corresponding to the selected name in the second display area according to the classifying table.

5. The method for managing the error information of the printed circuit board layout system as described in claim 4 further comprising:

checking for a count greater than zero in each box;

causing the checkbox corresponding to the one number box to be not selectable if the number in one number box is zero; and causing the checkbox corresponding to the one number box to be selectable if the number in one number box is greater than zero.

6. The method for managing error information of the printed circuit board layout system as described in claim 4 further comprising: highlighting a selected set of coordinates and highlighting the error marker corresponding to the selected set of coordinate in the first user interface in the displayed wiring diagram.

* * * * *